(12) United States Patent
Yamashita et al.

(10) Patent No.: US 6,447,960 B2
(45) Date of Patent: Sep. 10, 2002

(54) ELECTRON BEAM EXPOSURE MASK AND PATTERN DESIGNING METHOD THEREOF

(75) Inventors: Hiroshi Yamashita; Fumihiro Koba, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/819,806

(22) Filed: Mar. 28, 2001

(30) Foreign Application Priority Data

Mar. 28, 2000 (JP) .......................................... 2000-088392

(51) Int. Cl.[7] .............................. G03F 9/00; G03C 5/00
(52) U.S. Cl. ............................ 430/5; 430/296; 430/942
(58) Field of Search ............................... 430/5, 296, 942

(56) References Cited

U.S. PATENT DOCUMENTS 5,849,437 A * 12/1998 Yamazaki et al. .......... 430/296

FOREIGN PATENT DOCUMENTS

TW          364154         7/1999

* cited by examiner

*Primary Examiner*—Christopher G. Young
(74) *Attorney, Agent, or Firm*—Hutchins, Wheeler & Dittmar

(57) ABSTRACT

First, a mask pattern is defined to a plurality of lattice shaped regions of a uniform dimension. Then, the lattice shaped regions which are adjacent to each other are assigned to different complementary masks. In this manner, the shape of an opening through which electron beams pass is determined so that a displacement caused by a stress acting to each location in the complementary masks is less than a predetermined value.

12 Claims, 8 Drawing Sheets

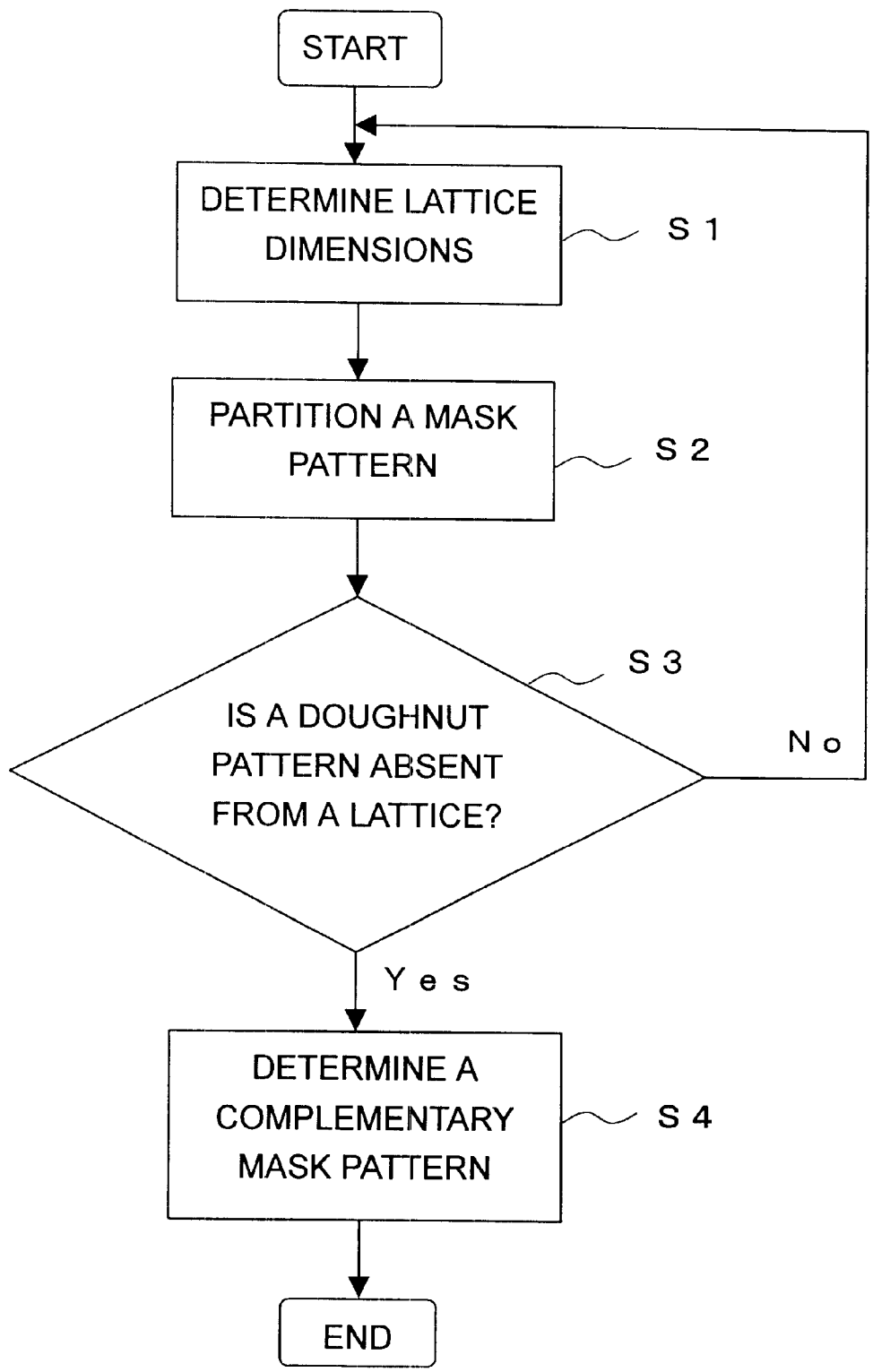

FIG. 9
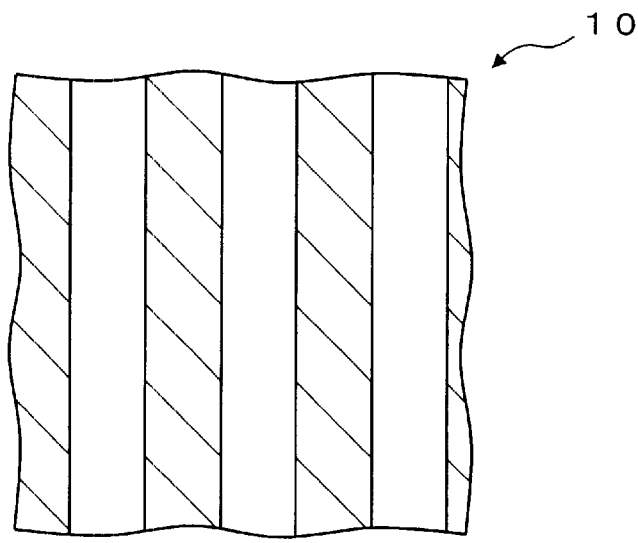
FIG. 10A  FIG. 10B
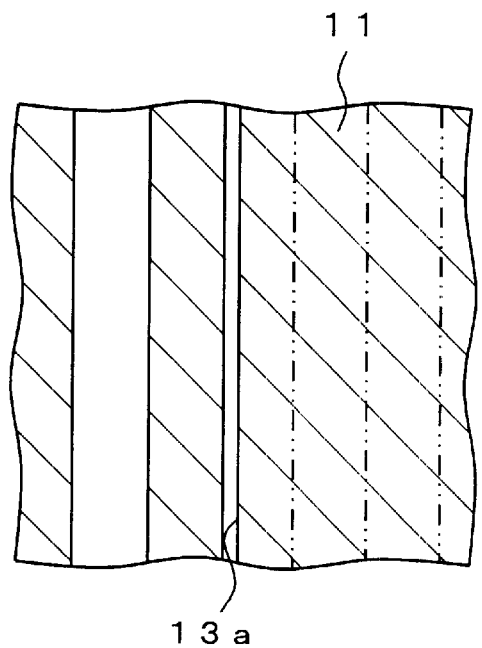
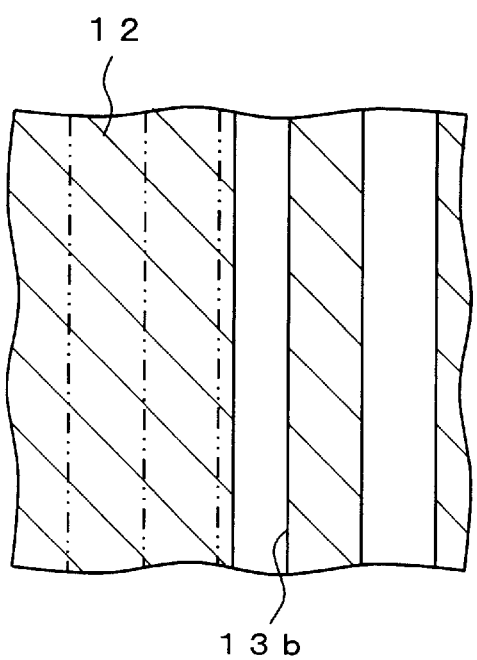

ELECTRON BEAM EXPOSURE MASK AND PATTERN DESIGNING METHOD THEREOF

BACKGROUND OF THE INVENTION

1. Field of the Invention

The present invention relates to an electron beam exposure mask used for transferring a fine pattern in a semiconductor device manufacturing process and the like, and a pattern designing method thereof, more particularly, relates to an electron beam exposure mask for preventing deformation of a stencil mask and a pattern designing method thereof.

2. Description of the Related Art

In a process of manufacturing a semiconductor integrated circuit device, there has been practically used a fine processing technology for drawing an integrated circuit pattern by drawing electron beams (EB) and using a focused beam of charged particles. For example, in an electron beam exposure system, electron beams are emitted to a wafer on which an electron beam sensitive resist is applied, whereby an integrated circuit pattern is directed exposed to the electron beam sensitive resist. An EB mask is used in order to obtain a drawing pattern caused by electron beams. Such techniques for drawing electron beams using such electron beams include a character projection technique of projecting a mask pattern in a reduced size to image a unit region such as a memory cell in batch. In addition, a mask used for character projection to emit a circuit pattern onto a wafer in batch includes a stencil mask having a hole for electron beams to pass, the stencil mask transferring a circuit pattern.

In the stencil mask, however, in a region whose periphery is surrounded by a mask hole, any portion for supporting this region does not exist, and thus, a stencil mask having such a pattern cannot be fabricated. Such a problem is generally called a "doughnut" problem.

Conventionally, two masks are used for a mask pattern having such a doughnut problem, thereby fabricating a stencil mask. FIG. 1A is a plan view showing a designed mask pattern having the doughnut problem. FIG. 1B is a plan view showing an example of a complementary mask relevant to the mask pattern shown in FIG. 1A. FIG. 1C is a plan view showing another example of the complementary mask.

For example, in the case where a mask pattern 20 consisting of a doughnut pattern 20a and a line pattern opening 20b provided therein is designed, as shown in FIG. 1A, there are used a first complementary mask 21 on which there are formed a mask hole 23a that is half of the doughnut pattern 20a and a mask hole 23b of a line pattern opening 20b, and a second complementary mask 22 having a mask hole 23c that is the residue of the doughnut pattern 20a, as shown in FIG. 1B. As shown in FIG. 1C, there may be used a first complementary mask 21 on which there are formed a mask hole 23d that correspond to one side of the doughnut pattern 20a and a mask hole 23b of a line pattern opening 20b, and a second complementary mask 22 on which there is formed a mask hole 23e that corresponds to the remaining three sides of the doughnut pattern 20a.

In this way, an inside region of the doughnut pattern 21a is supported by using two complementary masks 21 and 22, and a line pattern designed in that region can be left.

However, although the above mentioned complementary masks 21 and 22 are used, whereby a stencil mask can be fabricated while avoiding the doughnut problem, there is a problem that a deformation such as warping occurs in the fabricated stencil mask. Namely, for example, in the second complementary mask 22 shown in FIG. 1B, a region extending like a tongue is supported with a point on a line segment connecting ends of the mask hole 23c being a fulcrum. However, in the case where strength in the boundary region is low, a deformation such as warping may occur in a region that extends like a tongue. Further, in the case where a deformation is significant, a breakage may occur. Such a deformation becomes significant in the second complementary mask shown in FIG. 1C. In addition, the above deformation may occur similarly in the first complementary mask 21 shown in FIG. 1B as well. Such a problem may be called a "tongue" problem. In addition, in the case where mask pattern ends are proximal to each other, and a portion for supporting a portion that extends like a tongue is very small, the above-described deformation occurs significantly. Such a problem may be called a "leaf" problem.

In addition, in a line and space (L/S) pattern such as a bit line and a word line for a memory as well, there is a problem that a stencil mask is deformed. FIG. 2A is a plan view showing a stencil mask immediately after a mask hole has been formed. FIG. 2B is a plan view showing a stencil mask after a washing process after the mask hole has been formed.

As shown in FIG. 2B, in a stencil mask for an L/S pattern 24, in a washing process performed after the mask hole 25 has been formed, there is a problem that adjacent line portions come into contact with each other due to surface tension of pure water or the like, and cannot be separated by a force between molecules.

Such a problem that the line portions come into contact with each other exists in a variety of patterns if a deformation is greater than a predetermined extent. Considering the fact that a complicated mask pattern increases, it is very difficult to fabricate the stencil mask at a present stage. FIG. 3 is a plan view showing an example of a comparatively complicated stencil mask.

SUMMARY OF THE INVENTION

It is an object of the present invention to provide an electron beam exposure mask hardly deformed by a washing process or the like after a mask hole has been formed, the electron beam exposure mask being capable of performing exposure with high dimensional precision and a pattern designing method thereof.

According to one aspect of the present invention, an electron beam exposure mask comprises a mask body being defined to a plurality of lattice shaped regions with a uniform dimension. An opening through which electron beams pass is provided at only one of two lattice shaped regions which are adjacent to each other among the plurality of lattice shaped regions. Lattice shaped regions in which the opening may be provided configure a checkerboard pattern.

According to another aspect of the present invention, an electron beam exposure mask comprising a mask body being defined to a plurality of first lattice shaped regions with a first uniform dimension. First openings through which electron beams pass are provided at any of first lattice shaped regions which are not adjacent to each other among the plurality of first lattice shaped regions. First lattice shaped regions in which the first opening does not exist are defined to a plurality of second lattice shaped regions with a second uniform dimension smaller than the first uniform dimension. Second openings through which electron beam pass are provided at only one of two second lattice shaped regions which are adjacent to each other among the plurality of second lattice shaped regions.

Conventionally a complementary mask pattern is determined in order to avoid the doughnut problem. In contrast, in the present invention, an opening exists only in one of the lattice shaped regions that are adjacent to each other or no opening exists in a lattice shaped region in which first and second openings do not exist. Therefore, a portion at which a deformation is locally significant does not exist, and, for example, a mask deformation is unlikely to occur in a washing process using pure water as well. As a result, the yield of an electron exposure mask increases, and its dimensional precision is improved.

In addition, in a line and space shaped pattern, if the shape of an opening is determined so that a displacement caused by a stress acting to each location is less than a predetermined value, its dimensional precision is improved and its dimensional precision is also improved.

According to the present invention, the shape of an opening is determined so that a displacement after the opening has been formed is less than a predetermined value. Thus, for example, in the washing processing using pure water, holder attachment process, and an electron beam exposure process in which a temperature rise occurs or the like as well, a mask deformation can be restrained. Thus, the yield of an electron beam exposure mask can be improved, and its dimensional precision can be improved.

In addition, if a lattice shaped region is assigned so as to configure a checkerboard pattern, a complicated algorithm is eliminated, and very simple design can be made. Further, the pattern density between complementary masks becomes almost uniform, beam blurring due to the Coulomb effect becomes uniform, and the precision of an exposed pattern can be improved.

BRIEF DESCRIPTION OF THE DRAWINGS

FIG. 4 is a flow chart showing a pattern designing method according to a first embodiment of the present invention;

FIG. 9 is a plan view showing part of an L/S pattern;

FIG. 10A and FIG. 10B are plan views showing first and second complementary masks when the L/S pattern shown in FIG. 9 is distributed based on a reference formula, respectively;

DESCRIPTION OF THE PREFERRED EMBODIMENT

Hereinafter, an electron beam exposure mask pattern designing method according to embodiments of the present invention will be described with reference to the accompanying drawings. A first embodiment describes a pattern designing method relevant to a mask pattern shown in FIG. 1A. FIG. 4 is a flow chart showing a pattern designing method according to the first embodiment of the present invention.

Figure 1A:
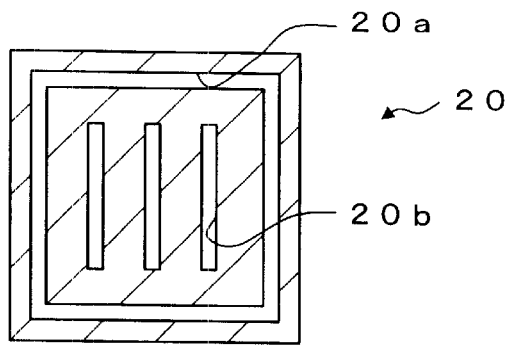
FIG. 1A is a plan view showing a designed mask pattern having a doughnut problem.
Figure 1B:
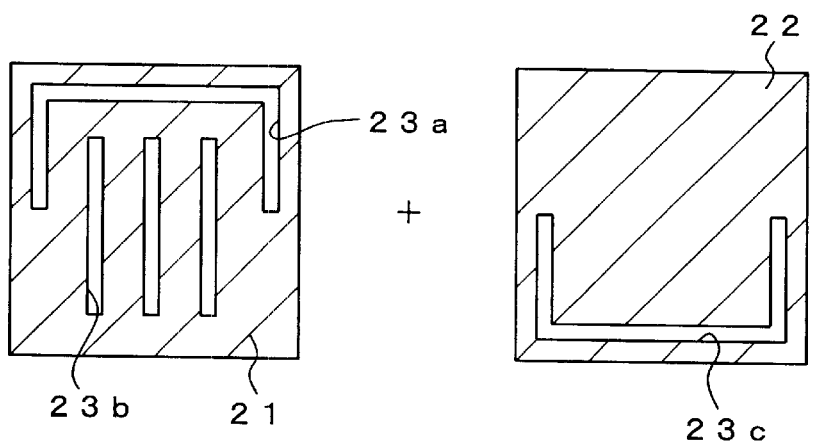
FIG. 1B is a plan view showing a complementary mask relevant to the mask pattern shown in FIG. 1A.
Figure 1C:
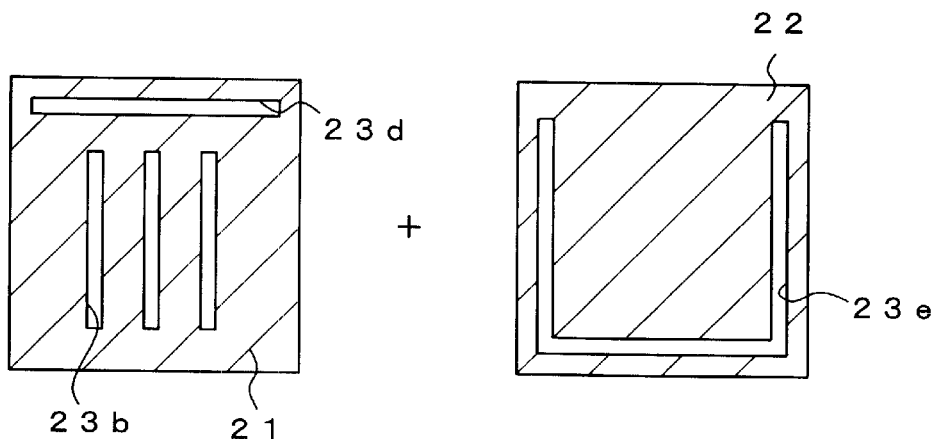
FIG. 1C is a plan view showing another example of the complementary mask.

In the first embodiment, a uniform checkerboard lattice dimension is determined based on the material, thickness and pattern dimension of a mask body used such that a displacement caused by the stress acting to each location inside of the mask is less than a predetermined value when the mask pattern shown in FIG. 1A is partitioned into the checkerboard lattice shaped region, and each region is mask-formed into two complementary masks (step S1). At this time, there is no need to particularly consider whether or not a doughnut pattern is present in the each checkerboard pattern shaped region.

For example, at a portion that is a both-end support beam such as an L/S pattern, the maximum displacement $\delta_1$ obtained by formula 1 is defined to be less than half of the width of the opening. At a portion that is a cantilever beam such as a tongue pattern, the maximum displacement $\delta_2$ obtained by formula 2 is defined to be less than half of the width of the opening.

$$\delta_1 = \frac{Pa^3}{48EI} + \frac{5Wa^4}{384EI} \qquad \text{[Formula 1]}$$

$$\delta_2 = \frac{(P+W)a^4}{8EI} \qquad \text{[Formula 2]}$$

In formulas 1 and 2, "P" denotes a scale of a uniformed load; "a" denotes a length of beam; "E" denotes a Young's modulus of a mask material; "I" denotes a geometrical moment of inertia; and "W" denotes a weight per unit length. In addition, the geometrical moment of inertia I is expressed by formula 3 when the width of beam is defined as "b", and the thickness of beam is defined as "t".

$$I = \frac{bt^3}{12} \qquad \text{[Formula 3]}$$

The standards for setting a predetermined value of a displacement in the present invention are not limited to these formulas, and another setting standard can be provided based on a variety of experimental formulas. For example, the surface tension of pure water used for washing can be considered.

Next, a mask pattern is partitioned in the lattice dimension determined in accordance with the above-described process (step S2).

Next, it is judged whether or not a doughnut pattern exists inside of each of the regions partitioned in a checkerboard lattice shape (step S3).

As a result of the judgment, if no doughnut pattern exists in any lattice shaped region, patterns in lattice shaped regions that are not adjacent to each other in the lattice shaped regions partitioned into the checkerboard patterns are collected, and the collected patterns are determined as two complementary mask patterns, respectively (step S4).

On the other hand, as the result of the judgment, if there is a lattice shaped region in which a doughnut pattern exists, processes from determining the above-described lattice dimension to judging the presence of a doughnut pattern, for example, are carried out about that region. While the checkerboard lattice dimension is reduced to be smaller than the previous value until no doughnut pattern has existed during judgment, for example, while the dimension is reduced to be half of the previous lattice dimension, these processes are repeated (steps S1 to S3).

Then, at a time when a judgment that no doughnut pattern exists in a lattice shaped region with its minimum dimension is obtained, a mask pattern to be set to two complementary masks is determined (step S4). That is, with respect to a lattice shaped region judged that no doughnut pattern exists at a first judgment, patterns in lattice shaped regions that are not adjacent to each other in the lattice shaped regions partitioned into the checkerboard pattern are collected. With respect to a lattice shaped region judged that a doughnut pattern exists, patterns that are sequentially partitioned and exist in partitions that are not adjacent to each other are collected, and the finally collected patterns are determined as mask patterns of two complementary masks, respectively.

Figure 5A:
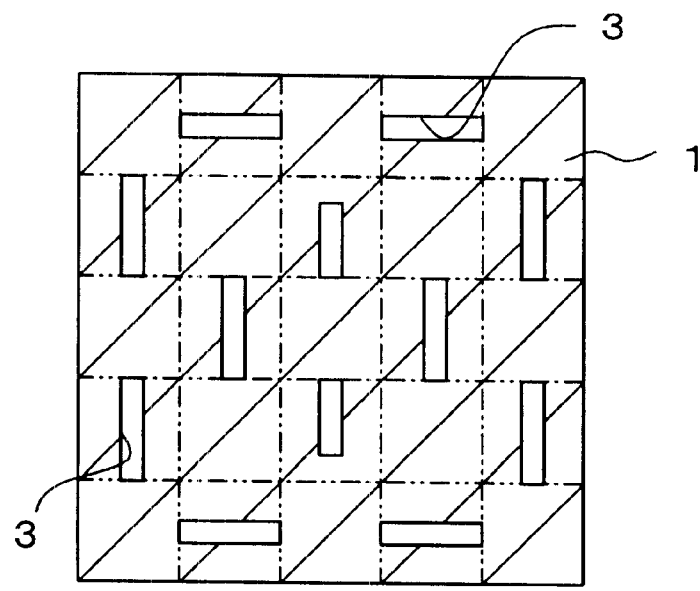
FIG. 5A and FIG. 5B are plan views showing first and second complementary masks obtained according to the first embodiment, respectively.
Figure 5B:
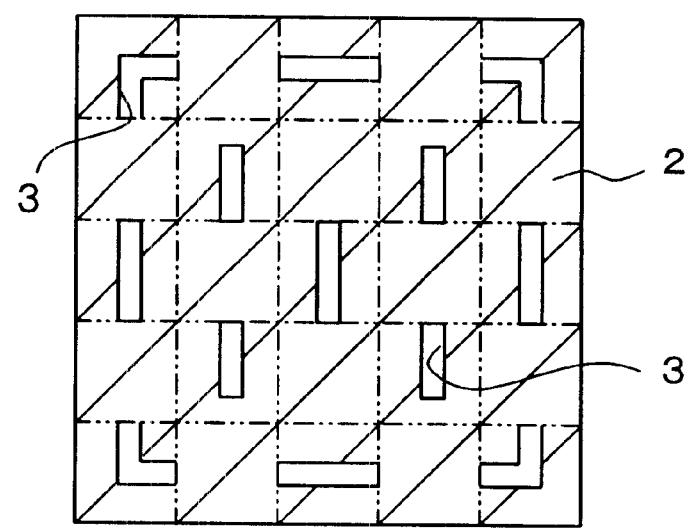

FIG. 5A and FIG. 5B are plan views showing first and second complementary masks obtained according to the first embodiment, respectively. In the first embodiment, a uniform lattice dimension is determined so that a displacement caused by a stress acting to each location in the mask is less than a predetermined value. Thus, as shown in FIG. 5A and FIG. 5B, in any of the first and second complementary masks 1 and 2 as well, any of the "tongue" problem and "leaf" problem does not exist. In addition, these masks are partitioned into checkerboard lattice shaped regions, and thus, a problem of "doughnut" exceeding its lattice dimension is eliminated at this time. Even if a "doughnut" pattern exists in a lattice shaped region, the presence or absence of such a pattern is then judged, and repartitioning is performed. Thus, all the "doughnut" problems are eliminated.

As shown in FIG. 5A and FIG. 5B, the density of mask holes 3 is almost uniform between the complementary masks 1 and 2. In the case where electron beam exposure is performed by using the first and second complementary masks 1 and 2, beam sags are substantially identical to each other. Thus, beam blurring due to the Coulomb effect is substantially identical, and high dimensional precision can be obtained in an exposed pattern.

In the above-described method, a pattern is divided, and is assigned to two complementary masks. In the case of high pattern density, mask patterns are divided into three or more with considering a Coulomb effect so as to be assigned to three or more complementary masks.

Many mask patterns are partitioned into the checkerboard lattice shaped regions as shown in the first embodiment, whereby the density of mask holes between the complementary masks, i.e., pattern density is substantially uniform, for example, within 10% in deviation. However, in the case where three complementary masks are used, there may occur deviation in pattern density if the mask patterns are merely partitioned into the checkerboard region considering a distribution of displacements caused by a mask material and the like. In such a case, it is desirable that deviation in pattern density is considered to be within 10% in determining lattice dimension in order to equalize the size of beam blurring due to the Coulomb effect.

In addition, in the first embodiment, in the case where a doughnut pattern exists in a lattice shaped region, such a pattern is partitioned into the checkerboard lattice shaped region again in order to perform judgment. However, even if the doughnut pattern in this lattice shaped region is partitioned to be halved, when no "tongue" problem occurs because the displacement caused by the stress acting to the mask is less than a predetermined value, the doughnut pattern may be merely partitioned to be halved as in a conventional manner.

Figure 6:
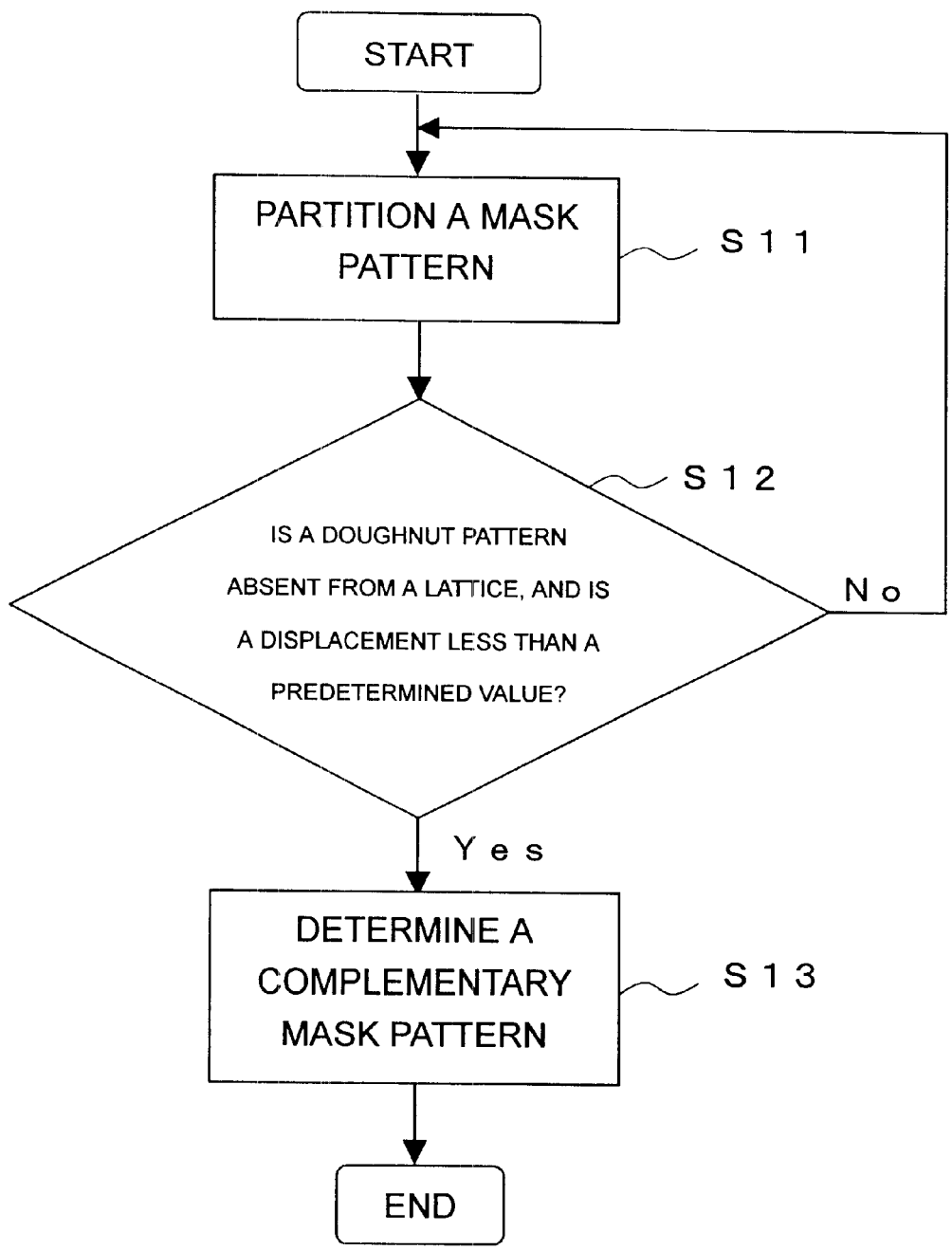
FIG. 6 is a flow chart showing a pattern designing method according to a second embodiment of the present invention.

Now, a second embodiment of the present invention will be described here. FIG. 6 is a flow chart showing a pattern designing method according to the second embodiment of the present invention.

In the second embodiment, a mask pattern is first partitioned into a uniform checkerboard pattern of a proper uniform lattice dimension based on experiment or experience (step S11). The lattice dimension is about 10 micrometers to 40 micrometers, for example, without being limited thereto.

Next, patterns arranged in each lattice shaped region are sampled in that region, the displacement caused by the stress acting to each location is less than a predetermined value, and it is judged whether or not a doughnut pattern exists (step S12).

As a result of this judgment, if a position where a displacement is more than a predetermined value does not exist in any region as well, and if no doughnut pattern exists, patterns existing in lattice shaped regions that are not adjacent to each other in the lattice shaped regions partitioned into a checkerboard pattern are collected, and the collected patterns are determined as mask patterns of two complementary masks, respectively (step S13).

On the other hand, in the case where there exists a position at which a displacement is equal to or greater than a predetermined value or in the case where a doughnut pattern exists, the above-described processes of partitioning into a proper size and of determination are performed for such a lattice shaped region. These processes are repeated until it is judged that the stress at each position becomes less than a predetermined value and no doughnut pattern has existed (steps S11 and S12). The size of lattice dimension used here may be smaller than that at the previous stage, for example, ½ of the lattice dimension of the previous stage.

Then, at a time when it is judged that the displacement of each location in the lattice shaped region of the minimum dimension is less than a predetermined value, and no doughnut pattern exists, a mask pattern to be set to two complementary masks is determined (step S13).

In the thus-obtained complementary masks as well, as in the first embodiment, the doughnut problem, tongue problem and leaf problem are eliminated. Such a method is effective in the case where a pattern to be fabricated is not evident. In addition, in the second embodiment, when a smaller lattice dimension is determined at first, it is often judged that the dimension is less than a predetermined value, and no doughnut pattern exists in the subsequent judgment. Alternatively, a material and thickness and the like of a mask is not considered in determining lattice dimension. Thus, a smaller lattice dimension is determined to be about 5 micrometers to 20 micrometers, for example, whereby the number of processes can be significantly reduced depending on a mask pattern.

According to the second embodiment as well, many mask patterns are automatically set to be substantially uniform in pattern density, for example, within 10% in difference.

However, there may occur a deviation in pattern density depending on a mask pattern. In such a case, it is desirable to take a consideration into such that the deviation of pattern density is within 10% in a uniform determining lattice dimension in order to make beam blurring due to the Coulomb effect uniform.

In addition, in the second embodiment, in the case where there is a location at which a displacement is equal to or greater than a predetermined value in a lattice shaped region or in the case where a doughnut pattern exists, such a pattern is partitioned into a checkerboard lattice shaped region again in order to perform judgment. However, as in the first embodiment, even if the doughnut pattern in this lattice shaped region is partitioned to be halved, when there is no "tongue" problem because the displacement caused by the stress acting to the mask is smaller than a predetermined value, the doughnut pattern may be merely partitioned to be halved as in the conventional manner.

In the first and second embodiments, a complicated mask pattern may exist, and a variety of reference formulas are required for the displacement of each location. Thus, in carrying out these methods, it is desirable that data obtained by tabulating reference formulas such as formula 1 or formula 2 relevant to a variety of patterns is stored so as to read out the data conveniently.

In addition, the first and second embodiments can be applied to a L/S (line and space) pattern. For example, in a silicon based stencil mask of 2 micrometers in thickness, the lattice dimension may be 40 micrometers or less in an L/S pattern of 0.48 micrometer in width; the lattice dimension may be 20 micrometers or less in an L/S pattern of 0.4 micrometer in width; and the lattice dimension may be 10 micrometers or less in an L/S pattern of 0.32 micrometer in width.

Figure 7A:
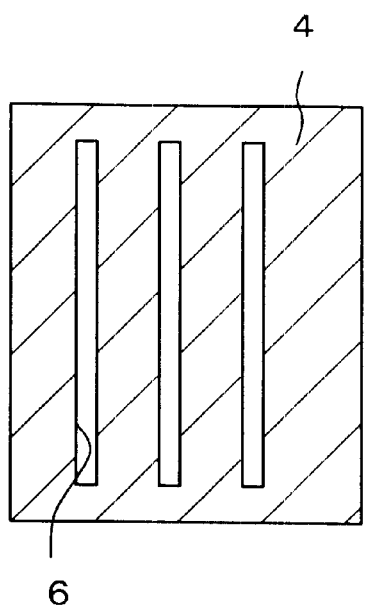
FIG. 7A and FIG. 7B are plan views showing first and second complementary masks obtained according to a third embodiment, respectively.
Figure 7B:
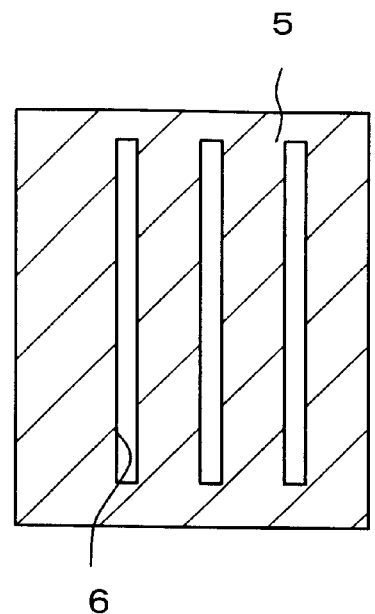

Now, a third embodiment of the present invention will be described here. The third embodiment describes a pattern designing method relevant to an L/S pattern shown in FIG. 2A. FIG. 7A and FIG. 7B are plan views showing first and second complementary masks obtained according to the third embodiment, respectively.

Figure 2A:
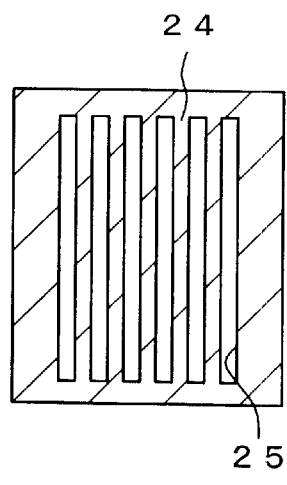
FIG. 2A is a plan view showing a stencil mask immediately after a mask hole has been formed.
Figure 2B:
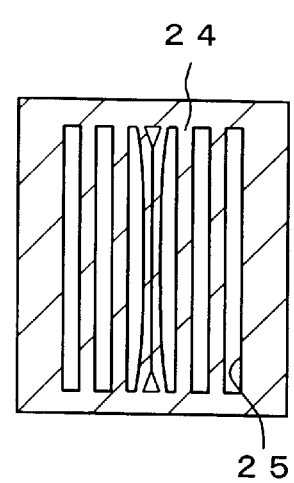
FIG. 2B is a plan view showing a stencil mask after a washing process after the mask hole has been formed.
Figure 3:
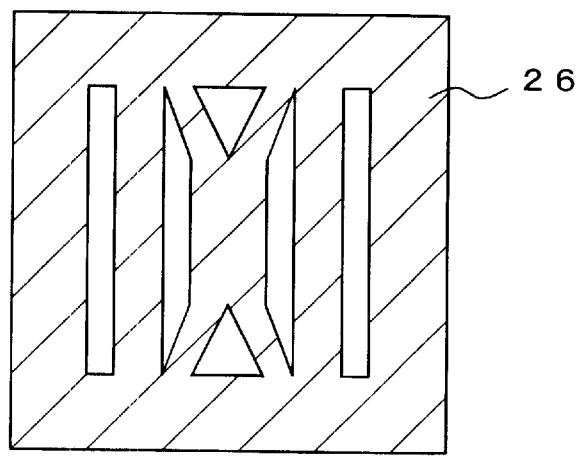
FIG. 3 is a plan view showing an example of a comparatively complicated stencil mask.

In the third embodiment, the location and shape of the mask hole are determined so that the displacement caused by the stress acting to each location of the complementary masks is less than a predetermined value. That is, as shown in formula 1, in the complementary masks, as the width of a portion that is a both-end supporting beam is wider and as the length of that portion is shorter, the maximum displacement is smaller. Specifically, as shown in FIG. 7A and FIG. 7B, a space portion in an L/S pattern shown in FIG. 2A is distributed to the first and second complementary masks 4 and 5 alternately, thereby forming a mask hole 6.

Thus, in the first and second complementary masks 4 and 5 fabricated according to the third embodiment, L/S pattern space portions are distributed alternately. Thus, the width of the beam portion in each of the complementary masks 4 and 5 is wider than that in mask pattern, and a maximum displacement is reduced. This prevents line portions from coming into contact with each other during the subsequent washing process. In addition, pattern density is uniform between the first and second complementary masks 4 and 5, and thus, beam blurring due to the Coulomb effect is equal to each other.

In an L/S pattern, of course, there is no need to consider the doughnut problem, tongue problem and leaf problem.

Figure 8A:
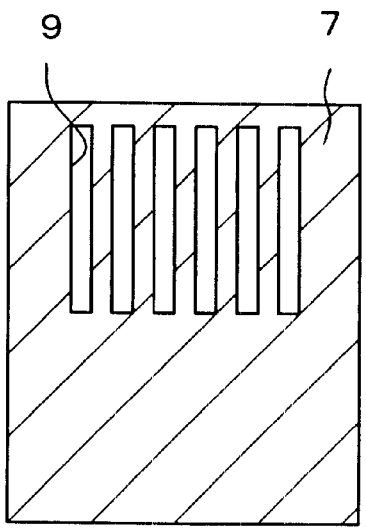
FIG. 8A and FIG. 8B are plan views showing first and second complementary masks obtained according to a fourth embodiment, respectively.
Figure 8B:
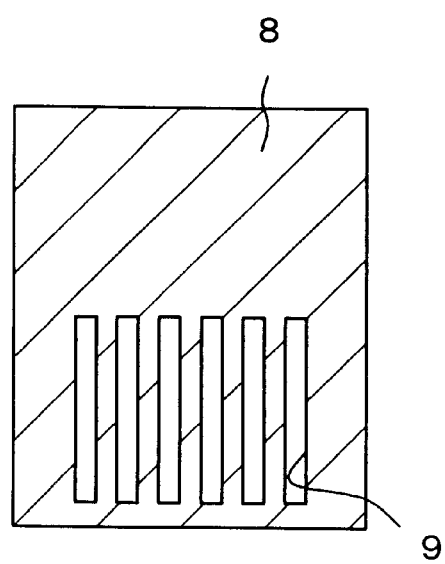

Now, a fourth embodiment of the present invention will be described here. The fourth embodiment describes another pattern designing method relevant to an L/S pattern shown in FIG. 2A. FIG. 8A and FIG. 8B are plan views showing first and second complementary masks obtained according to the fourth embodiment, respectively.

In the fourth embodiment as well, the location and shape of the mask hole are determined so that the displacement caused by the stress acting to each location of the complementary mask is less than a predetermined value relevant to the L/S pattern. At this time, as in the third embodiment, the location and shape of the mask hole can be determined considering the reference formula of formula 1, for example. Specifically, as shown in FIG. 8A and FIG. 8B, a space portion in an L/S pattern shown in FIG. 2A is vertically partitioned. The upper half is distributed for a first complementary mask 7, and the lower half is distributed for a second complementary mask 8, thereby forming a mask hole 9.

In this way, in the first and second complementary masks 7 and 8 fabricated according to the fourth embodiment, the L/S pattern space portion is vertically partitioned so that a length of a beam portion in each of the complementary masks 7 and 8 becomes half of that in mask pattern, and the maximum displacement is reduced. Thus, the line portions are prevented from coming into contact with each other in the subsequent washing process. In addition, pattern density is uniform between the first and second complementary masks 7 and 8, and beam blurring due to the Coulomb effect is equal to each other.

In the third and fourth embodiments, it is first required to sample a dangerous site at which the line portions likely to come into contact with each other, considering the material and shape of the mask relevant to a mask pattern. Thus, a long time is required as compared with the second embodiment.

Figure 11A:
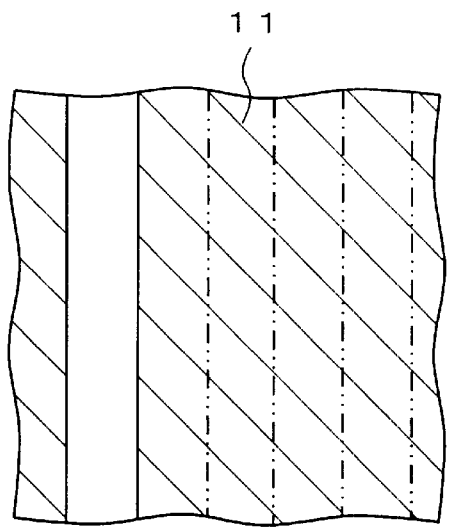
FIG. 11A and FIG. 11B are plan views showing first and second complementary masks after boundary processing, respectively.
Figure 11B:
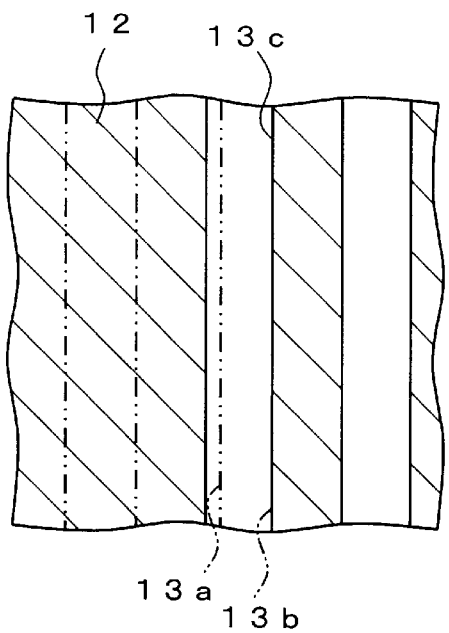

In addition, in the first to fourth embodiments, in the case where a complementary mask pattern is determined based on a predetermined reference formula, one opening pattern is distributed into two complementary masks. As a result, a mask hole with its very small width may be defined in a complementary mask. In such a case, the processing becomes difficult, and thus, it is desirable that one distributed mask hole be formed in another complementary mask. Hereinafter, such processing is called boundary processing. FIG. 9 is a plan view showing part of the L/S pattern; FIG. 10A and FIG. 10B are plan views showing first and second complementary masks when the L/S patterns shown in FIG. 9 are distributed respectively based on the reference formula; and FIG. 11A and FIG. 11B are plan views showing first and second complementary masks after boundary processing, respectively.

In the case of the L/S pattern 10 shown in FIG. 9 is distributed merely based on the reference formula, as shown in FIG. 10A and FIG. 10B, a mask hole 13$a$ with its very small width may be assigned to a first complementary mask 11, and a mask hole 13$b$ with its slightly small width may be assigned to a second complementary mask 12. In such a case, as shown in FIG. 11A and FIG. 11B, if a mask hole 13$a$ is defined for the second complementary mask 12, a wide mask hole 13$c$ is configured from the mask holes 13$a$ and 13$b$. Thus, a mask hole with its small width is eliminated from the complementary masks 11 and 12, and the processing is facilitated. However, in this case as well, it is desirable that pattern density be approximate between the two complementary masks 11 and 12, for example, that a deviation is within 10%.

Figure 12A:
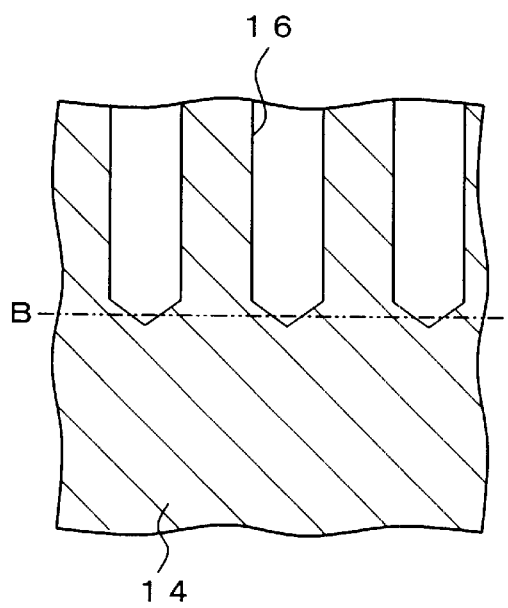
FIG. 12A and FIG. 12B are plan views showing first and second complementary masks when multiple exposure is employed in the L/S pattern shown in FIG. 9, respectively.

In addition, in the fourth embodiment, a technique called multiple exposure may be employed. FIG. 12A and FIG.

12B are plan views showing first and second complementary masks when multiple exposure is employed in the L/S pattern shown in FIG. 9, respectively.

Figure 12B:
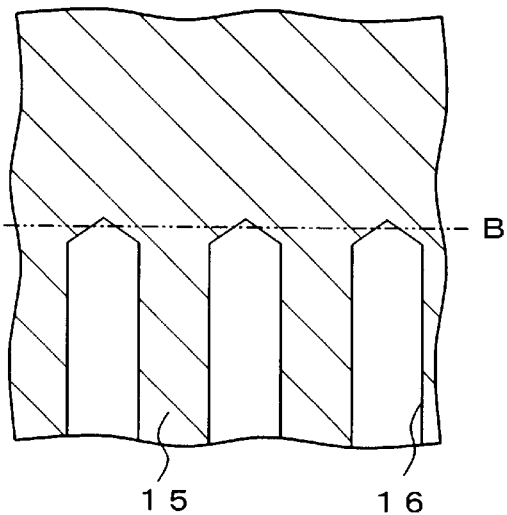

In the case where employing multiple exposure, as shown in FIG. 12A and FIG. 12B, a space portion in the L/S pattern shown in FIG. 9 is vertically partitioned, and the shape at one end on the side of a boundary B of the mask hole 16 in the first and second complementary masks 14 and 15 shown in FIGS. 12A, 12B is tapered.

By employing such multiple exposure, even if a slight displacement occurs with connection of an exposed pattern, there is provided an advantageous effect that a variation in line width is reduced.

The number of complimentary masks relevant to one mask pattern is not limited to two, and may be three or more. However, if three or more complementary masks are used, the number of exposures increases. Thus, it is desirable that the number of complementary masks is two from the viewpoint of throughput.

What is claimed is:

1. An electron beam exposure mask, comprising:
   a mask body being defined to a plurality of lattice shaped regions with a uniform dimension, an opening through which electron beams pass being provided at only one of two lattice shaped regions which are adjacent to each other among said plurality of lattice shaped regions.

2. The electron beam exposure mask according to claim 1, wherein lattice shaped regions in which said opening is provided configure a checkerboard pattern.

3. An electron beam exposure mask comprising:
   a mask body being defined to a plurality of first lattice shaped regions with a first uniform dimension, first openings through which electron beams pass being provided at any of first lattice shaped regions which are not adjacent to each other among said plurality of first lattice shaped regions, first lattice shaped regions in which said first opening does not exist being defined to a plurality of second lattice shaped regions with a second uniform dimension smaller than said first uniform dimension, and second openings through which electron beam pass being provided at only one of two second lattice shaped regions which are adjacent to each other among said plurality of second lattice shaped regions.

4. The electron beam exposure mask according to claim 3, wherein an opening is not provided at first lattice shaped region in which said first and second openings are not provided.

5. The electron beam exposure mask according to claim 1, wherein said uniform dimension is determined to be associated with Young's modulus and thickness of a material of said mask body and a mask pattern to be exposed.

6. The electron beam exposure mask according to claim 3, wherein said first and second uniform dimensions are determined to be associated with Young's modulus and thickness of a material of said mask body and a mask pattern to be exposed.

7. An electron beam exposure mask used for line and space shaped pattern exposure, comprising:
   a mask body having openings through which electron beams pass, a shape of said opening being determined to be associated with a width, length and thickness of a line portion so that a displacement caused by a stress acting to each portion is less than a predetermined value.

8. A pattern designing method of an electron beam exposure mask in which a mask pattern is assigned to a plurality of complementary masks, said method comprising the step of:
   determining a shape of an opening in a mask body through which electron beams pass so that a displacement caused by a stress acting to each location in said complementary mask is less than a predetermined value.

9. The electron beam exposure mask pattern designing method according to claim 8, wherein the step of determining a shape of an opening comprises the steps of:
   defining said mask pattern in a plurality of lattice shaped regions with a uniform dimension; and
   assigning lattice shaped regions which are adjacent to each other among said plurality of lattice shaped regions to different complementary masks.

10. The electron beam exposure mask designing method according to claim 9, wherein the number of said complementary masks is two or more, and an assigned lattice region configures a checkerboard pattern in any of said complementary masks.

11. The electron beam exposure mask designing method according to claim 9, wherein the step of defining said mask pattern comprises the step of determining a uniform dimension of said lattice shaped region to be associated with Young's modulus and thickness of a material of said complementary masks and said mask pattern.

12. The electron beam exposure mask designing method according to claim 8, wherein said mask pattern is a line and space shaped pattern, and the step of determining a shape of an opening comprises the step of determining the shape to be associated with a width, length and thickness of a line portion.

* * * * *